(12) United States Patent
Herkenrath et al.

(10) Patent No.: US 8,885,358 B2
(45) Date of Patent: Nov. 11, 2014

(54) PLUG-IN MODULE FOR CONTROLLERS OF MOBILE WORKING MACHINES

(75) Inventors: Peter Herkenrath, Bottrop (DE); Markus Lenzing, Ludinghausen (DE); Henner Ruschkamp, Lunen (DE); Johannes Wesselmann, Dortmund (DE)

(73) Assignee: Caterpillar Global Mining Europe GmbH, Lunen (DE)

( * ) Notice: Subject to any disclaimer, the term of this patent is extended or adjusted under 35 U.S.C. 154(b) by 174 days.

(21) Appl. No.: 13/516,487

(22) PCT Filed: Dec. 14, 2010

(86) PCT No.: PCT/IB2010/055814
§ 371 (c)(1),
(2), (4) Date: Aug. 21, 2012

(87) PCT Pub. No.: WO2011/073909
PCT Pub. Date: Jun. 23, 2011

(65) Prior Publication Data
US 2012/0327619 A1 Dec. 27, 2012

(30) Foreign Application Priority Data
Dec. 16, 2009 (DE) ............. 20 2009 014 865 U

(51) Int. Cl.
*H05K 7/14* (2006.01)
*H05K 7/18* (2006.01)
*H05K 1/14* (2006.01)

(52) U.S. Cl.
CPC .......... *H05K 7/1477* (2013.01); *H05K 1/148* (2013.01); *H05K 7/1468* (2013.01); *H05K 1/14* (2013.01)

USPC ........................................... 361/801

(58) Field of Classification Search
CPC .. B60R 2021/01006; H02B 1/24; H02B 1/36; H05K 1/144; H05K 3/0052; H05K 3/368; H05K 1/148; H05K 1/14; H05K 7/1477; H05K 7/1468; H06F 1/181; H06F 13/409; H02G 5/066
USPC .................. 361/801, 784, 785, 792, 796
See application file for complete search history.

(56) References Cited

U.S. PATENT DOCUMENTS

| 4,158,757 A | * | 6/1979 | Reichert et al. ............ 200/302.1 |
| 4,715,822 A | * | 12/1987 | Stribel .......................... 439/74 |
| 5,428,535 A | * | 6/1995 | Katsumata et al. ............. 701/36 |

(Continued)

FOREIGN PATENT DOCUMENTS

| CN | 2596413 Y | 12/2003 |
| CN | 1490903 A | 4/2004 |
| DE | 10 2008 025 938 A1 | 12/2009 |
| EP | 0 209 072 A2 | 1/1987 |

*Primary Examiner* — Lisa Lea Edmonds
*Assistant Examiner* — Keith Depew
(74) *Attorney, Agent, or Firm* — Foley & Lardner LLP

(57) ABSTRACT

A plug-in module for controllers of mobile working machines, having a housing, a connection plug, electronics boards and at least one plug socket for connecting actuators or sensors. The housing being formed by a box with a front, rear and side walls as well as a base plate comprising a cutout for the connection plug, and in that the electronics boards are forming a board box by connecting two end boards and two side boards, with the board box being arranged in the interior of the housing, and with the plug socket being mechanically coupled to the housing by a strain-relief clip.

11 Claims, 2 Drawing Sheets

(56) References Cited

U.S. PATENT DOCUMENTS

| | | | |
|---|---|---|---|
| 5,501,605 A * | 3/1996 | Ozaki et al. | 439/34 |
| 5,708,568 A * | 1/1998 | Ostendorf | 361/749 |
| 6,016,253 A * | 1/2000 | Seitz et al. | 361/735 |
| 6,317,332 B1 * | 11/2001 | Weber et al. | 361/760 |
| 6,597,579 B1 * | 7/2003 | Reszat et al. | 361/731 |
| 7,230,833 B1 * | 6/2007 | Sickels | 361/747 |
| 2006/0120083 A1 * | 6/2006 | Trojanowski et al. | 362/294 |
| 2009/0023320 A1 | 1/2009 | De Carolis et al. | |
| 2009/0040736 A1 * | 2/2009 | Becherer et al. | 361/749 |
| 2013/0135802 A1 * | 5/2013 | Fornage | 361/679.01 |

\* cited by examiner

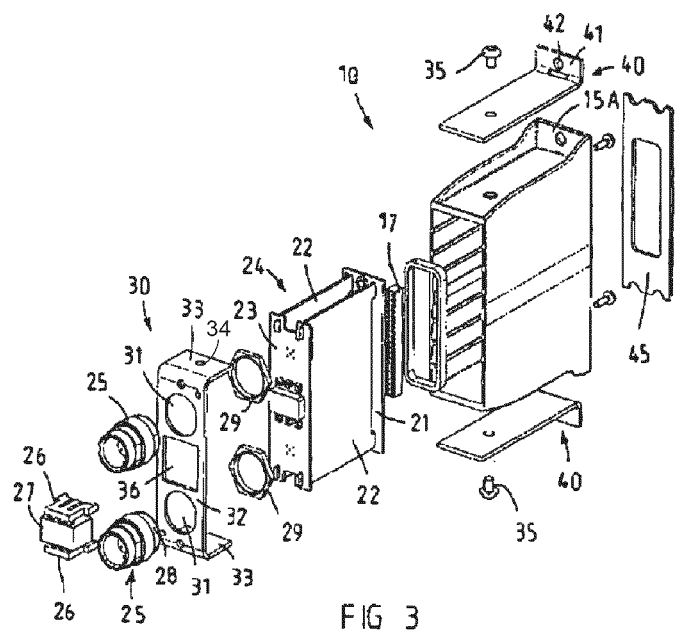
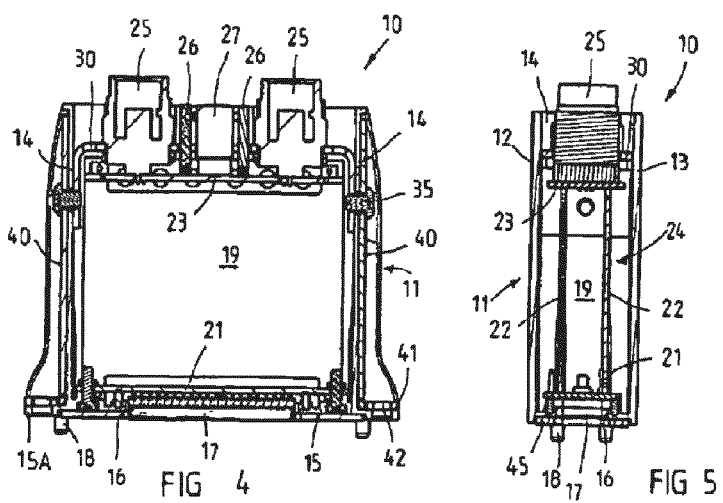

PLUG-IN MODULE FOR CONTROLLERS OF MOBILE WORKING MACHINES

The invention relates to a plug-in module for controllers of mobile working machines, in particular of extraction machines, for aboveground or underground mining, having a housing, having a connection plug which is exposed on one side of the housing and can be detachably connected to a bus board of a controller, having an electronics board which is arranged in the housing, and having at least one plug socket, which is exposed on the housing, for connecting actuators or sensors or the like for the working machine to the plug-in module.

BACKGROUND OF THE INVENTION

Mobile working machines are used for mining mineral deposits such as coal seams, ore deposits, brown coal deposits, but also for mining quarries, salt deposits or the like, all the control electronics containing all the functions required for semiautomatic or automatic execution of the working processes in said mobile working machines being associated with one or more controllers which is/are arranged "onboard" the mobile working machine. In mobile working machines, all the structural parts and components which are to be used are, in principle, subject to restrictions in terms of size and weight, it being necessary, at the same time, on account of the mobility, to provide for adequate protection against vibrations since vibrations occur on account of the movement of the working machine in addition to the actual working movement. In mining machines, which form the preferred field of application of the present invention, it may additionally be necessary to make provision for all the control electrics and control electronics to be constructed and designed to be intrinsically safe in order to reliably prevent ignition sparks or ignition voltages being created in areas which are subject to explosion hazards.

Due to the increasing trend for automation, greater demands are increasingly being made on the onboard control system of the mobile working machine and diagnostics options, in particular remote diagnostics options, are being demanded for improved operability. In order to establish a fully automatic manner of operation, the control electronics also have to be capable of being able to evaluate sensors of measurement and diagnostics systems and sensors for exploring the area surrounding the mobile working machine and, at the same time, to drive a wide variety of actuators.

SUMMARY OF THE INVENTION

An object of the invention is to provide a plug-in module for controllers of mobile working machines which is suitable for use with a wide variety of actuators or sensors or can be adapted for this purpose and, at the same time, can be used advantageously in an onboard controller of a mobile working machine.

According to the invention, this object and others are achieved in that the housing consists of a box with a preferably rectangular housing wall arrangement comprising a front wall, a rear wall, two side walls and a base plate which is provided with a cutout for the connection plug for connecting the plug-in module to a bus board of a controller, and in that the electronics boards are connected to two end boards and two side boards to form a board box, with the board box being arranged in the interior of the housing, the connection plug being electrically conductively connected to one end board of the board box and the at least one plug socket being electrically conductively connected to the opposite end board, and the plug socket being mechanically coupled to the housing by means of a strain-relief clip. The effects of connecting a plurality of electronics boards to form a board box are firstly that individual boards with different functions can be connected to one another in a relatively simple manner and, at the same time, a relatively flexurally rigid control electronics system which is highly insusceptible to faults caused by vibrations and impact loads can be provided for the plug-in module. For its part, the strain-relief clip between the plug socket and the plastic housing, together with the box-like structure of the electronics boards, ensures a sufficient degree of robustness of the overall structure since tensile and compressive loads on the plug socket can be diverted into the housing via the strain-relief clip without damaging the electronics in the housing.

In an especially advantageous embodiment, the housing consists of a plastic housing with a preferably integrally formed base plate. In the case of a plug-in module according to the invention, a plastic housing provides a relatively lightweight housing which, at the same time, is advantageously resistant to environmental influences such as moisture, dirt and the like, and can be produced in a relatively cost-effective manner on a large scale. The use of a plastic housing instead of a solid stainless steel housing, as has been used to date in mining in particular, ensures considerable standardization in terms of weight and size.

According to a particularly advantageous embodiment, the strain-relief clip consists of a U-shaped bent sheet-metal part, in particular composed of metal such as stainless steel. The bent sheet-metal part can be connected to the plastic housing in a particularly simple manner by virtue of the U-shaped design of the bent sheet-metal part by, for example, a screw connection being established between the end pieces of the bent sheet-metal part and the side walls of the wall arrangement of the plastic housing. It is particularly advantageous when the bent sheet-metal part has bent end limbs and a central limb, with the central limb being provided with at least one receiving hole for a plug socket and the end limbs being connected, for example screwed, to the side walls of the plastic housing. For the purpose of further minimization, it is particularly advantageous when a plurality of receiving holes, in particular two receiving holes for fixing a plurality of, in particular two, plug sockets are provided in the central limb. When there are two plug sockets, two sensors or actuators can be connected to each plug-in module, it being possible to meet all the requirements of intrinsic safety relatively easily with round plug sockets in particular.

In order to achieve simple mounting, it is especially advantageous when the plug socket or sockets is/are fixed directly or indirectly to the central limb of the tensioning clip by means of a screw connection. For the purpose of direct screw connection, each receiving hole can be provided with a thread to which a threaded connection piece on the plug socket can be directly tightly screwed. For the purpose of indirect screw connection, each plug socket can be provided with a socket extension having an external thread, said socket extension being passed through the receiving hole from one side, with a nut being screwed onto the threaded portion from the other side in order to secure the plug socket to the central limb in a rotationally fixed and tension-resistant manner. As an alternative or in addition, the central limb can be provided with one or more windows for signal indicator means in order to indicate, for example using LEDs, whether an operable actuator is connected to the plug socket and/or whether this actuator is being driven at the current time.

In order to additional reinforce the plug-in module, it is advantageous when the side walls of the plastic housing have associated L-shaped lugs which can be or are connected to the strain-relief clip and extend as far as the base plate of the housing or plastic housing. In the most simple refinement, the L-shaped lugs can be loosely fitted from outside and then be connected to the fixing means for the bent sheet-metal part and to the plastic housing by way of the said fixing means for the bent sheet-metal part. The housing or plastic housing and lugs are advantageously fixed by way of fixing means for tightly screwing the plug-in module to the bus board or base plate. The L-shaped lugs on the one hand and the bent sheet-metal part on the other then form an extremely stable fixed and shielded arrangement for the plug sockets and the electronics boards in the mounted state. According to an especially advantageous refinement, the base plate projects laterally beyond the side walls by way of a fixing web, and the fixing web and the lug limb of the respective lug are provided with a passage for a fixing means for locking the plug-in module to the bus board.

In order to avoid incorrect mounting, the connection plug which is associated with the base plate can expediently be arranged asymmetrically offset in relation to a side wall, the front wall or the rear wall of the housing or plastic housing. Incorrect mounting can also be additionally or alternatively prevented by adjustment pins if they allow the plug-in module to be mounted on the bus board only in a specific position.

The adjacent end boards and side boards which are connected to form a board box are preferably in each case electrically connected to one another by means of at least one flexible conductor track. The adjacent end boards and side boards are preferably only plugged to one another by, for example, the end edges of the side boards being provided with locking projections which are passed through slots in the end boards and bolted.

In order to avoid moisture, dirt and other environmental influences entering the interior of the plastic housing, a seal is preferably incorporated between the base wall-end end board of the board box and the base plate of the plastic housing, and/or a seal, which surrounds the connection plug, is arranged on the outer face of the base plate of the plastic housing. Further preferably, the plug sockets can protrude beyond the upper edge of the plastic housing and the interior of the plastic housing is filled with encapsulation compound. By filling the entire plug-in module with encapsulation compound, the plug-in module can also satisfy the requirements of a protection class such as IP65 or IP68, with the mechanical stability of the plug-in module being increased by the encapsulation compound at the same time.

These and other objects, aspects, features, developments and advantages of the invention of this application will become apparent to those skilled in the art upon a reading of the Detailed Description of Embodiments set forth below taken together with the drawings which will be described in the next section.

BRIEF DESCRIPTION OF THE DRAWINGS

FIG. 3 shows an exploded illustration of the plug-in module from FIG. 2;

FIG. 4 shows a longitudinal section through the plug-in module from FIG. 3; and

FIG. 5 shows the plug-in module from FIG. 2 in section parallel to the side walls.

DETAILED DESCRIPTION OF EMBODIMENTS

Figure 1:
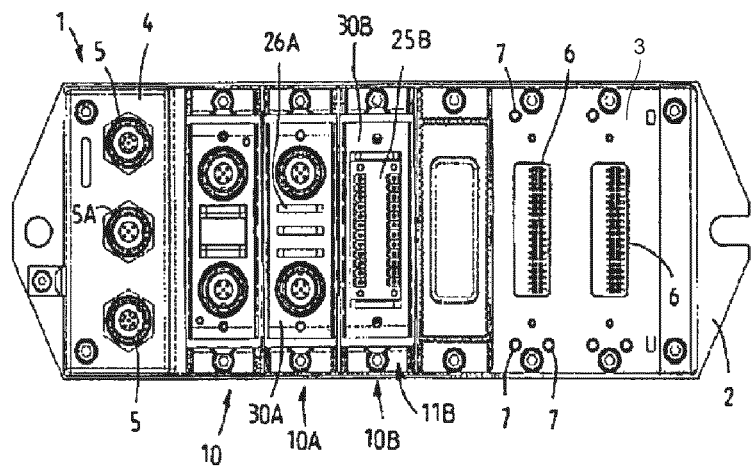
FIG. 1 shows a plan view of a controller having a bus board with six plug-in spaces, with plug-in modules according to the invention being plugged into three plug-in spaces.
Figure 2:
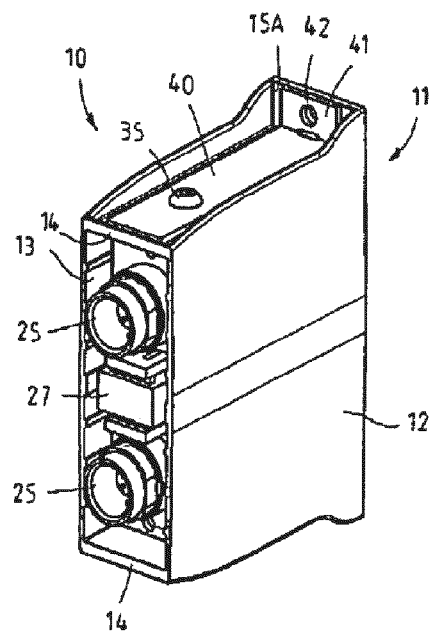
FIG. 2 shows a perspective view of a preferred refinement of a plug-in module according to the invention.

Referring now to the drawings wherein the showings are for the purpose of illustrating preferred and alternative embodiments of the invention only and not for the purpose of limiting same, FIG. 1 shows a highly simplified schematic plan view of a controller in which the plug-in modules according to the invention are preferably used and which is designed, in particular, for use on mobile working machines which are used in areas which are subject to explosion hazards. The controller 1 comprises a base plate 2, for example composed of stainless steel, on which a backplane or bus board 3 with, in this case, six plug-in spaces 6 is fixed in a suitable manner. The bus board 3 is, in addition to the plug-in spaces, provided with conductor tracks and electronics elements (not illustrated) and the individual plug-in spaces 6 are connected to the terminal block 4 which, in this case, is arranged centrally on one side of the base plate 2 of the controller 1. In this case, the terminal block 4 has three round plugs 5, 5A, it being possible for the round plugs 5, 5A to be designed, for example, in such a way that one round plug 5 forms a network input, one round plug 5 forms a network output and a third round plug 5A forms a power supply connection for electrical voltage, in particular an intrinsically safe DC voltage. Plug-in modules 10, 10A, 10B according to the invention are already inserted into three of the plug-in spaces 6 in the bus board 3 of the controller 1, with, in the exemplary embodiment shown, the three inserted plug-in modules 10, 10A, 10B largely having the same structure but being equipped with different functionalities and having slightly different indicator devices or connection plugs. Each plug-in space 6 is preferably provided with a plurality of non-uniformly distributed adjustment holes 7 in order to avoid incorrect mounting of a plug-in module 10, 10A, 10B. The structure of the plug-in modules 10, 10A, 10B will now be explained with reference, in particular, to FIGS. 2 to 5 in which the plug-in module 10 is illustrated in detail.

The plug-in module 10 has an integral plastic housing 11 which is preferably produced using an injection-moulding process and has a front wall 12, a rear wall 13, two side walls 14 and also an integrally formed base plate 15, and the plastic housing is preferably designed in the form of a box. The base plate 15 is provided with a cutout 16 within which a connection plug 17 is freely accessible in such a way that the connection plug 17 is held in the plug-in space (6, FIG. 1) which is formed on the controller (1, FIG. 1) when the plug-in module 10 is connected to the controller. The connection plug 17 is preferably arranged in a manner asymmetrically offset in relation to the front wall 12 or the rear wall 13, so that the plug-in module 10 can be mounted on the controller with only one orientation so as to establish a plug-type connection between the connection plug 17 and the associated plug-in space. In order to avoid incorrect mounting and, at the same time, to reliably establish a plug-type connection, integrally formed adjustment pins 18, which can be inserted into the adjustment holes (7, FIG. 1) for each plug-in space in an interlocking manner, can be formed on the base plate 16.

In the exemplary embodiment shown, the connection plug 17 is firmly soldered to a lower end board 21 which, together with two side boards 22 and a further end board 23, forms a board box 24 which can be arranged entirely within the interior 19 of the plastic housing. As a result, the entire electronics system is provided with a robust and flexurally rigid structure on account of the box-like structure of the said board box with end boards 23 which are reinforced by means of the side boards 22. The side boards 22 and the end boards 21, 23 are plugged to one another to form the board box 24, for which purpose the side boards 22 have projections which are passed through slots in the end boards and can be bolted to the protruding projection portion. The connection contacts of two plug sockets 25 are connected, in particular soldered, to the second, upper end boards 23 which are composed of metal round plug sockets in the exemplary embodiment shown. In each case adjacent boards, for example the lower end boards 21 and the side boards 22 or the side boards 22 with the upper end board 23, are connected to one another by means of flexible conductor tracks (not shown), and therefore all the control and switching electronics which are integrated in the plug-in module 10 can be arranged in a manner distributed over the printed circuit boards 21, 22, 23 with any desired functions. On account of this design, it is also possible to fit identical end boards 21, 23 with different side boards 22 in order to adapt each plug-in module to its functionalities in a cost-effective manner. Furthermore, indicator elements 26 for simple monitoring functions or signal blocks 27 for visualizing text or values can be connected to the printed circuit board 23 for the plug sockets 25.

FIGS. 3 to 5 clearly show that the two plug sockets 25 are fixed to a U-shaped bent sheet-metal part 30 which, for fixing the round plugs 25, is provided with two receiving holes 31 which are oval in this case. In the exemplary embodiment shown, the round plugs 25 are screwed only indirectly to a central limb 32 of the bent sheet-metal part 30 and each round plug 25 has a threaded extension 28 onto which a fixing nut 29 is screwed from the other side of the bent sheet-metal part 30 in order to secure the round plugs 25 to the bent sheet-metal part 30 in a tension-resistant and rotationally fixed manner. The central limb 32 of the bent sheet-metal part 30 merges with a respective end limb 33 which is bent at a right angle, with the bent sheet-metal part 33 being screwed to the side walls 14 of the plastic housing 11 via threaded holes 34 in the end limb 33 and by means of fixing screws 35 in the mounted state. Since the connection plugs 25 are screwed to the bent sheet-metal part 30 and the bent sheet-metal part 30 is, in turn, screwed to the plastic housing 11, the bent sheet-metal part 30 can form a strain-relief clip which prevents forces which could be exerted on the plug-in modules by cables which are connected to the connection plugs 25 from being able to be transmitted to the electronics boards. The central limb 32 is provided, centrally between the two receiving holes 31, with a window 36, which is rectangular in this case, so that the indicator elements 26, 27 are exposed, so that they are visible, on the upper face of the plug-in module 10.

In order to lend additional rigidity to the plastic housing 11, L-shaped connection lugs 40 are loosely screwed from the outside to the two end faces 14 by means of the fixing screws 35. In each case one bent, short lug limb 41 of the lugs 40 has a passage hole 42 for a locking screw by means of which the plug-in module 10 can be screwed to the base plate (2, FIG. 1) of the controller. The base plate 15 of the plastic housing 1 projects laterally beyond the side walls 14 of the plastic housing 11 by way of fixing webs 15A, with the lug limbs 41 being positioned parallel in front of the fixing webs 15A in the mounted state. The long limb portion of the connection lugs 40 has a passage hole for the fixing screw 35. In this way, all tensile forces can be introduced into the base plate of the controller directly via the strain-relief clip which is formed by the bent sheet-metal part 30, and the connection lugs 40 and all the internal fittings in the plug-in modules 10, in including the plastic housing, are not subjected to the action of these forces in the mounted state.

In the mounted state, the plug sockets 25 project, as can be seen in FIGS. 4 and 5, beyond the upper face of the side walls 14 and also the front wall 12 and the rear wall 13 of the plastic housing 11. A seal 45 is arranged beneath the base plate 15 of the plastic housing 11, the said seal surrounding the cutout 16 and, in this respect, also the connection plug 17, in order to prevent the ingress of moisture in the mounted state. The entire interior 19 of the plug-in module 10 is preferably filled with an encapsulation compound or the like in order to additionally reinforce the plug-in module 10 and, at the same time, to meet the requirements of protection classes such as IP65 or IP68.

The plug-in module 10A shown in FIG. 1 has the same internal structure as the plug-in module 10 but differs, for example, in terms of the electronics arranged on the boards and by virtue of the selection of different indicator elements 26A, in this case three indicator elements which are identical to one another, which each extend through a separate window in the strain-relief clip 30A. The plug-in module 10B also has the same structure as the plug-in module 10, in particular within the housing 11B, but differs, for example, by virtue of the electronics arranged on the boards and on account of the presence of only one flat plug 25B which extends through a single window in the strain-relief clip 30B.

Numerous modifications, which are intended to be covered by the scope of protection of the appended claims, are apparent to a person skilled in the art from the above description. Instead of round plugs and/or the indictor means shown, a flat plug can be arranged on the upper face of the plug-in module and/or the indicator elements can be dispensed with or designed differently, in particular when the plug-in module is not designed for intrinsically safe operation. A plug-in module can also have fewer or more than two plug sockets. The housing can also be composed of materials other than plastic, even though a plastic housing forms the preferred refinement.

Further, while considerable emphasis has been placed on the preferred embodiments of the invention illustrated and described herein, it will be appreciated that other embodiments, and equivalences thereof, can be made and that many changes can be made in the preferred embodiments without departing from the principles of the invention. Furthermore, the embodiments described above can be combined to form yet other embodiments of the invention of this application. Accordingly, it is to be distinctly understood that the foregoing descriptive matter is to be interpreted merely as illustrative of the invention and not as a limitation.

The invention claimed is:

1. A plug-in module for controllers of mobile working machines, in particular of extraction machines, the plug-in module comprising a housing, a connection plug which is accessible from one side of the housing and detachably connectable to an associated controller base plate of an associated controller, the plug-in module further comprising electronics boards which are arranged in the housing, and having a plurality of plug sockets which are accessible from the housing for connecting actuators or sensors or the like for an associated working machine to the plug-in module, the housing including a front wall, a rear wall, two side walls and a housing base plate which is provided with a cutout for the connection plug, the electronics boards forming a board box by connecting a first end board, a second end board opposite the first end board, and two side boards, with the board box being arranged in an interior of the housing, the connection plug being electrically conductively connected to the first end board of the board box and the plurality of plug sockets being electrically conductively connected to the second end board, and the plurality of plug sockets being mechanically coupled to the housing by a strain-relief clip, wherein the strain relief clip is a U-shaped bent sheet metal comprising a central limb and bent end limbs, the central limb being positioned parallel to the second end board and the bent end limbs being positioned perpendicular to the second end board and the central limb, wherein the bent end limbs are connected to the sidewalls of the housing, and wherein the central limb is provided with a plurality of receiving holes for the plurality of plug sockets.

2. The plug-in module according to claim 1, wherein the housing is a plastic housing with an integrally formed housing base plate.

3. The plug-in module according to claim 2, further including L-shaped lugs having a lug limb, the L-shaped lugs extending along at least a portion of the side walls of the plastic housing and being connected to the strain-relief clip and extending parallel to the housing base plate of the plastic housing by way of the lug limb.

4. The plug-in module according to claim 3, wherein the housing base plate projects laterally beyond the side walls by way of a fixing web, with the fixing web and the lug limb being provided with a passage for a fixing means for locking the plug-in module to the associated controller base plate.

5. The plug-in module according to claim 2, wherein the plurality of plug sockets protrude beyond an upper edge of the plastic housing and the interior of the plastic housing is filled with an encapsulation compound.

6. The plug-in module according to claim 1, wherein the at least one plurality of plug sockets are fixed directly or indirectly to the central limb of the strain-relief clip by a screw connection.

7. The plug-in module according to claim 1 wherein the central limb is provided with at least one window for signal indicator means.

8. The plug-in module according to claim 1, wherein the connection plug which is associated with the housing base plate is arranged in a manner asymmetrically offset in relation to at least one of a side wall, the front wall and the rear wall of the housing.

9. The plug-in module according to claim 1, further including a seal, the seal being inserted between one of the first end board and the second end board and the base plate.

10. The plug-in module according to claim 1, further including a seal, the seal surrounding the connection plug and being arranged on an outer face of the base plate.

11. The plug-in module according to claim 1, wherein the central limb abuts the second end board.

* * * * *

UNITED STATES PATENT AND TRADEMARK OFFICE
CERTIFICATE OF CORRECTION

PATENT NO. : 8,885,358 B2  
APPLICATION NO. : 13/516487  
DATED : November 11, 2014  
INVENTOR(S) : Herkenrath et al.

Page 1 of 1

It is certified that error appears in the above-identified patent and that said Letters Patent is hereby corrected as shown below:

In the claims

Column 8, lines 5-6, in Claim 6, delete "wherein the at least one plurality" and insert -- wherein the plurality --.

Signed and Sealed this
Seventeenth Day of November, 2015

Michelle K. Lee
*Director of the United States Patent and Trademark Office*